United States Patent
Castagnetti et al.

[11] Patent Number: 6,166,403
[45] Date of Patent: *Dec. 26, 2000

[54] INTEGRATED CIRCUIT HAVING EMBEDDED MEMORY WITH ELECTROMAGNETIC SHIELD

[75] Inventors: Ruggero Castagnetti, San Jose; Yauh-Ching Liu, Sunnyvale; Subramanian Ramesh, Cupertino, all of Calif.

[73] Assignee: LSI Logic Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/967,545

[22] Filed: Nov. 12, 1997

[51] Int. Cl.[7] .......................... H01L 27/10; H01L 29/00; H01L 23/48

[52] U.S. Cl. .......................... 257/211; 257/208; 257/508; 257/659; 257/758

[58] Field of Search ...................................... 257/294, 297, 257/340, 409, 503, 508, 659, 660, 662, 758, 693, 208, 211; 438/128, 129, 348, 361

[56] References Cited

U.S. PATENT DOCUMENTS 5,321,280  6/1994  Sakai ........................................ 257/758
5,594,279  1/1997  Itou et al. ................................ 257/758

FOREIGN PATENT DOCUMENTS 0 079 775  5/1983  European Pat. Off. .
0 791 963  8/1997  European Pat. Off. .
9-074172  3/1997  Japan .

*Primary Examiner*—Tom Thomas
*Assistant Examiner*—Hung K. Vu

[57] ABSTRACT

An integrated circuit including a substrate having a memory area and a non-memory area. An embedded memory is fabricated on the substrate within the memory area. First and second semiconductor cells are fabricated on the substrate within the non-memory area. An electromagnetic shield covers substantially memory area. A routing layer is fabricated over the memory and non-memory areas and over the electromagnetic shield. A signal wire is electrically coupled between the first and second semiconductor cells and has a conductive segment which is routed within the routing layer and extends over the memory area.

14 Claims, 4 Drawing Sheets

INTEGRATED CIRCUIT HAVING EMBEDDED MEMORY WITH ELECTROMAGNETIC SHIELD

BACKGROUND OF THE INVENTION

The present invention relates to integrated circuits and, more particularly, to an integrated circuit having an embedded memory and an integrated electromagnetic shield to allow routing over the embedded memory.

Semiconductor integrated circuits, such as complementary metal-oxide semiconductor (CMOS) circuits are now capable of being fabricated with large amounts of embedded memory. For example, an Application Specific Integrated Circuit (ASIC) which is fabricated with 0.25 micron technology may have an embedded 64 or 128 megabit memory, such as a dynamic random access memory (DRAM) or a static random access memory (SRAM).

A difficulty with embedded memory is that signal wires typically cannot be routed over memory. These signal wires can cause capacitive coupling with the signal wires that are routed within the memory. If the capacitive coupling is large enough to change a data value (a one or a zero) of a single memory cell, the data may be corrupted. This is particularly true for DRAM memory since the memory cells have small storage capacitors which are easily corrupted with a small amount of cross coupling.

Several factors aggravate this problem. As the performance of the integrated circuits continues to increase, the frequency of the signals within the integrated circuit increases, which increases the magnitude of the cross coupling. Also, the embedded memory must be compatible with the voltage levels and transistor sizes of the technology in which the integrated circuit is fabricated. As transistor sizes decrease, the voltage levels on the integrated circuit also decrease. This decreases the amount of charge on the small storage capacitors in an embedded DRAM memory. A smaller amount of charge is more easily corrupted. With 0.25 micron technology, the voltage levels on the integrated circuit are usually only 2.5 volts.

A common method of minimizing capacitive coupling is to develop design rules that do not allow signal wires to be routed over embedded memory blocks. The signal wires are routed around the memory rather than over the memory. Unfortunately, this leads to congested routing lanes and sacrifices flexibility in arranging memory and logic blocks, which compromises the density of integrated circuits having embedded memory.

SUMMARY OF THE INVENTION

The integrated circuit of the present invention includes a substrate having a memory area and a non-memory area. An embedded memory is fabricated on the substrate within the memory area. First and second semiconductor cells are fabricated on the substrate within the non-memory area. An electromagnetic shield covers the memory area. A routing layer is fabricated over the memory area and the non-memory area and over the electromagnetic shield. A signal wire is electrically coupled between the first and second semiconductor cells and has a conductive segment which is routed within the routing layer and extends over the memory area.

Another aspect of the present invention relates to a method of routing a signal wire in an integrated circuit which has an embedded memory in a memory area and first and second non-memory cells in a non-memory area. The method includes: applying an electromagnetic shield over the embedded memory; electrically coupling the electromagnetic shield to a voltage supply bus on the integrated circuit; and routing the signal wire from the first non-memory cell to the second non-memory cell such that the signal wire has a conductive segment that extends through the memory area and over the electromagnetic shield.

DETAILED DESCRIPTION OF THE PREFERRED EMBODIMENTS

Figure 1:
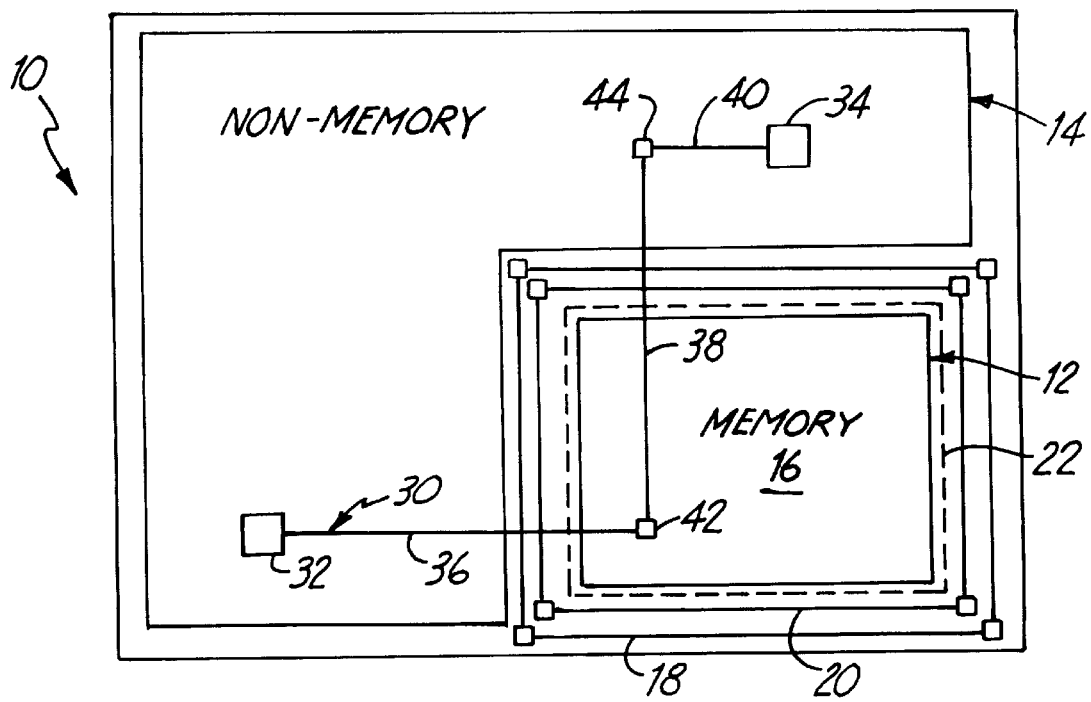
FIG. 1 is a simplified schematic representation of an integrated circuit according to the present invention.

FIG. 1 is a simplified schematic representation of an integrated circuit according to the present invention. Integrated circuit 10 includes a memory area 12 and a non-memory area 14. An embedded memory 16 is fabricated within memory area 14 and can include variety of memory types, such as a DRAM or an SRAM type memory, for example. Power and ground rings 18 and 20 may extend around the periphery of embedded memory 16 and are electrically coupled to internal power and ground buses (not shown) within the memory for supplying power to the internal elements of the memory. Power and ground rings 18 and 20 receive power from chip-level power and ground buses (not shown) which are provided on integrated circuit 10.

An electromagnetic shield 22 (shown in dashed lines) is fabricated over embedded memory 16 and preferably covers substantially the entire memory area 12. Electromagnetic shield 22 is positioned between the highest memory routing layer and the next higher logic routing layer on integrated circuit 10. Electromagnetic shield 22 is electrically coupled to a power or ground bus of integrated circuit 10 at a location within memory area 12 or at some other location outside of memory area 12. When electromagnetic shield 22 is "grounded" to a power bus or a ground bus, electromagnetic shield 22 forms a Faraday cage which prevents electromagnetic field lines from penetrating the area underneath the shield and corrupting data stored within embedded memory 16. To maximize the shielding capability, electromagnetic shield 22 should be free of perforations. However, electromagnetic shield 22 may be patterned to permit electrical connections across the shield wherever a conductive via connects a conductive segment in a routing layer above the shield with a conductive segment or element beneath the shield.

Electromagnetic shield 22 provides the flexibility to route signal wires on higher routing layers through memory area 12 without causing capacitive coupling between the higher level signal wires and the address or bit lines of embedded memory 12, which are routed on lower routing layers. For example, signal wire 30 is routed between semiconductor cells 32 and 34 which are fabricated within non-memory area 14. Signal wire 30 includes conductive segments 36, 38 and 40 and conductive vias 42 and 44. A portion of conductive segments 36 and 38 extend over embedded memory 16 and electromagnetic shield 22, through memory area 12. Electromagnetic shield 22 prevents conductive segments 36 and 38 from capacitively coupling with memory signal wires which are routed beneath the shield.

In one embodiment, integrated circuit 10 has five routing layers, which are referred to as metal routing layers M1–M5. The lowest routing layer, M1, may be formed on the substrate in one of the polysilicon layers or as a traditional metal routing layer. Routing layers M1, M3 and M5 have a preferred routing direction which is orthogonal to the preferred routing direction of routing layers M2 and M4. This minimizes capacitive coupling between adjacent routing layers. The signal wires within embedded memory 16 are typically routed in the lowest routing layers, such as routing layers M1 and M2. The signal wires for non-memory elements may be routed in all routing layers within non-memory area 14. If electromagnetic shield 22 is located between routing layers M2 and M3, for example, then the signal wires for the non-memory elements may also be routed in routing layers M3–M5 within memory area 12. For example, conductive segments 36 and 40 may be routed in routing layer M3 while conductive segment 38 may be routed in routing layer M4.

Figure 2A:
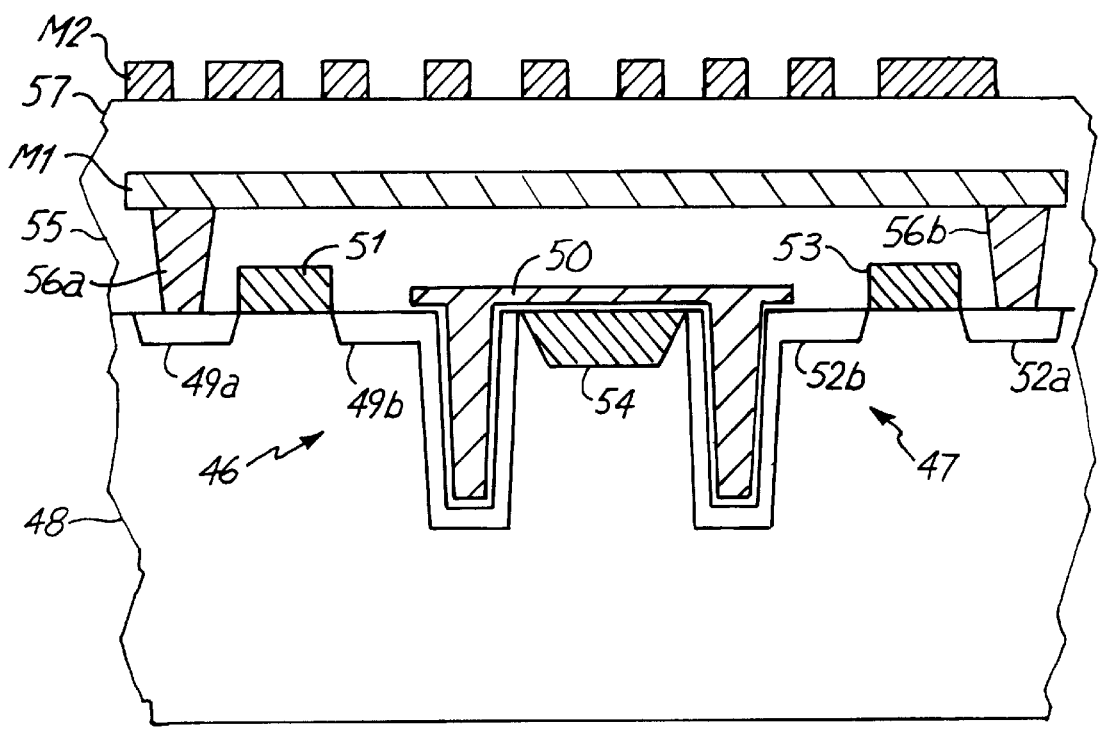
FIGS. 2A–2B are simplified, schematic representations of a cross-sectional view of the integrated circuit within a memory area illustrating two types of DRAM cells.
Figure 2B:
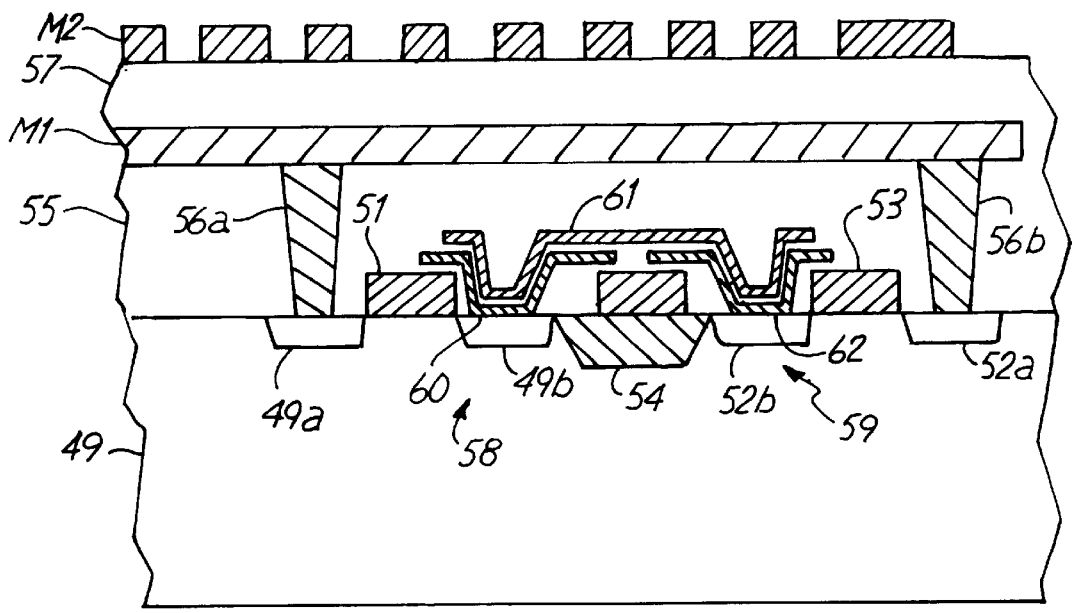

FIGS. 2A and 2B are simplified, schematic representations of a cross-sectional view of integrated circuit 10 within memory area 12 which illustrate two different types of DRAM cells. FIG. 2A illustrates one variety of a trench type of DRAM memory which includes DRAM cells 46 and 47. DRAM cells 46 and 47 are fabricated on substrate 48. DRAM cell 46 includes diffusion regions 49a and 49b, polysilicon trench plate 50 ("poly 1 layer") and polysilicon access gate 51 ("poly 2 layer"). DRAM cell 47 includes diffusion regions 52a and 52b, polysilicon trench plate 50 ("poly 1 layer") and polysilicon access gate 53 ("poly 2 layer"). A first storage capacitor is formed in DRAM cell 46 between diffusion region 49b and trench plate 50, and a second storage capacitor is formed in DRAM cell 47 between diffusion region 52b and trench plate 50. In one embodiment, trench plate 50 forms a common capacitor plate for all DRAM cells in memory 16. An oxide isolation region 54 is deposited between diffusion regions 49b and 52b to isolate DRAM cell 46 from DRAM cell 47.

Access gates 51 and 53 control the channels between diffusion regions 49a and 49b and between diffusion regions 52a and 52b, respectively, to provide access to the respective storage capacitors. Access gates 51 and 53 may be electrically coupled to a memory address line in memory 16 for addressing cells 46 and 47. Diffusion regions 49a and 52a may be coupled to a word line or to individual memory cell contacts for reading data from or writing data to cells 46 and 47.

Dielectric layer 55 is deposited on the surface of substrate 48, over DRAM cells 46 and 47, for isolating the cells from routing layer M1, which is deposited on the surface of dielectric layer 55. A planarization step may be performed after the deposition of each layer on integrated circuit 10. Conductive contacts 56a and 56b extend from routing layer M1 to the surface of substrate 48 for providing electrical connections between a conductive segment in routing layer M1 and diffusion regions 49a and 52a, respectively. A dielectric layer 57 is deposited on the surface of routing layer M1. Routing layer M2 is then deposited on the surface of dielectric layer 57.

The horizontal dimensions of routing layers M1 and M2 in FIG. 2A schematically indicate a preferred routing direction within those layers. For example, the long horizontal dimension of routing layer M1 represents a preferred routing direction along the width of the page, while the short horizontal dimension of routing layer M2 represents a preferred routing direction into the page. Other routing orientations can also be used. Individual conductive segments within routing layers M1 and M2 can be formed by an additive process or a subtractive process through known patterning techniques. These conductive segments can include row and column address lines and data bit lines for embedded memory 16, for example.

FIG. 2B illustrates one variety of a stack type DRAM memory which includes DRAM cells 58 and 59. The same reference numerals are used in FIG. 2B as were used in FIG. 2A for the same or similar elements. DRAM cell 58 includes diffusion regions 49a and 49b, polysilicon access gate 51 ("poly 1 layer"), polysilicon capacitor plate 60 ("poly 2 layer") and polysilicon capacitor plate 61 ("poly 3 layer"). DRAM cell 59 includes diffusion regions 52a and 52b, polysilicon access gate 53 ("poly 1 layer"), polysilicon capacitor plate 62 ("poly 2 layer") and polysilicon capacitor plate 61. Isolation region 54 is deposited between diffusion regions 49b and 52b. A first storage capacitor is formed in DRAM cell 58 between capacitor plates 60 and 61, and a second storage capacitor is formed in DRAM cell 59 between capacitor plates 62 and 61. In one embodiment, capacitor plate 61 forms a common capacitor plate for all DRAM cells in memory 16. Again, dielectric layer 55, routing layer M1, dielectric layer 57 and routing layer M2 are fabricated over substrate 48 and DRAM cells 58 and 59.

Figure 3A:
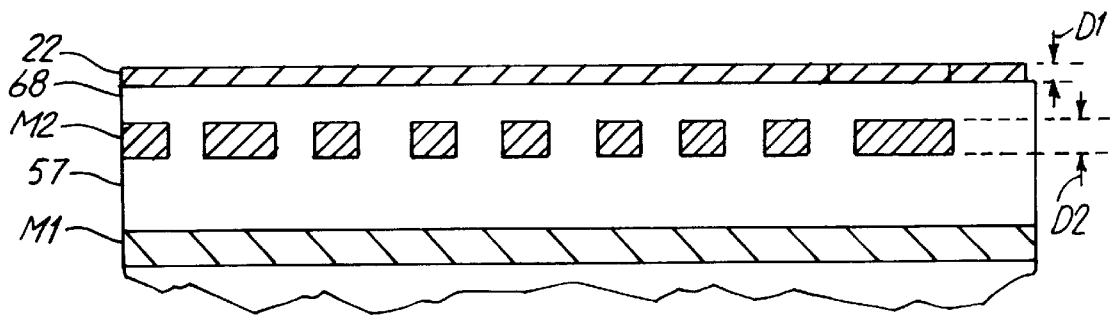
FIGS. 3A–3D are simplified, schematic representations of a cross-sectional view of the integrated circuit within a memory area during subsequent stages of fabrication.

FIGS. 3A–3D are simplified, schematic representations of a cross-sectional view of integrated circuit 10 within memory area 12 during subsequent stages of fabrication. For simplicity, FIGS. 3A–3D show only routing layer M1 and above. The substrate and corresponding DRAM cells are not shown. After routing layer M2 has been deposited, patterned and planarized, a dielectric layer 68 is applied to the surface of routing layer M2, as shown in FIG. 3A. A thin layer of conductive material is then deposited on dielectric layer 68 to form electromagnetic shield 22. As mentioned with reference to FIG. 1, electromagnetic shield 22 covers substantially the entire area of embedded memory 16. The conductive material used for forming electromagnetic shield 22 can be selected from a variety of materials, such as a titanium, aluminum, copper or aluminum-copper alloy, for example. Electromagnetic shield 22 can also be formed of multiple layers of different materials, if desired.

Electromagnetic shield 22 has a thickness D1 which is preferably less than or equal to one-half the thickness D2 of metal routing layers M1 and M2. This prevents electromagnetic shield 22 from significantly adding to the height of integrated circuit 10. Typical metal routing layer thicknesses are about 4,000 Å to 4,500 Å. Thickness D1 is preferably 100 Å to 2,500 Å, and most preferably 100 Å to 1000 Å.

Figure 3B:
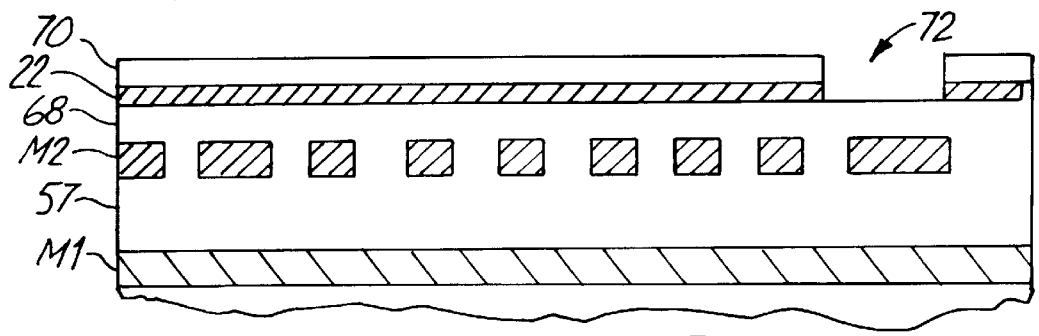

Referring to FIG. 3B, electromagnetic shield 22 is then patterned to allow electrical connections across the shield. A mask layer 70 is applied to the surface of electromagnetic shield 22 in a desired pattern, which includes an aperture 72, for example. The pattern is then etched into electromagnetic shield 22 through mask layer 70. Mask layer 70 is then removed from electromagnetic shield 22.

Figure 3C:
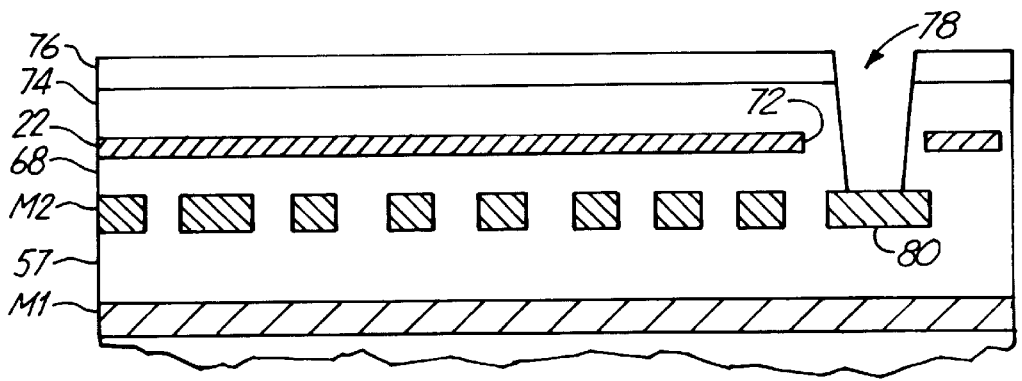

In FIG. 3C, a further dielectric layer 74 is applied to the surface of electromagnetic shield 22, and a mask layer 76 is applied to the surface of dielectric layer 74. Mask layer 76 has a pattern with an aperture 78 which overlies aperture 72. The pattern of mask layer 76, including aperture 78, is then etched into dielectric layers 74 and 68 (through aperture 72). When the etching is completed, conductive segment 80 in routing layer M2 is exposed within aperture 78. Mask layer 76 is then removed from dielectric layer 74.

Figure 3D:
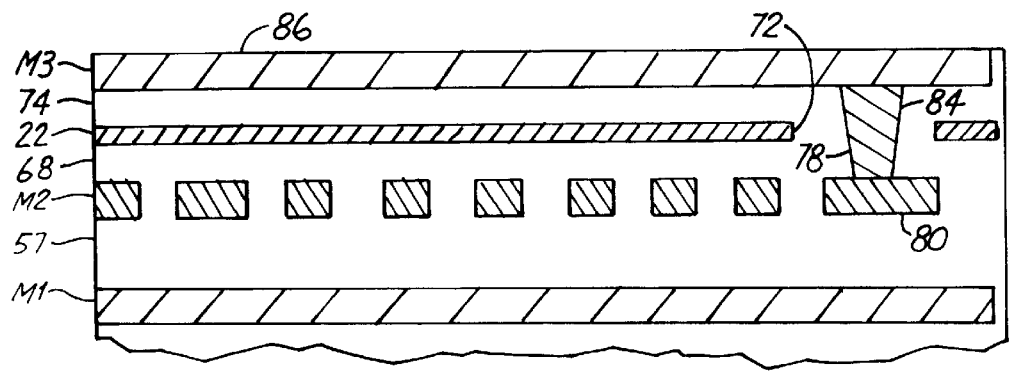

Next, aperture 78 is filled with a conductive material, such as a tungsten, as shown in FIG. 3D. The conductive material forms a conductive plug or via 84 which makes electrical contact with conductive segment 80 within aperture 78. Conductive via 84 is then planarized, and routing layer M3 is applied to the surface of dielectric layer 74. Routing layer M3 includes a conductive segment 86 which electrically contacts the surface of conductive via 84. Conductive via 84 therefore provides an electrical interconnection between conductive segment 86 on routing layer M3 and conductive segment 80 on routing layer M2. Routing layer M3 is then planarized for the application of subsequent dielectric and metal routing layers.

Figure 4A:
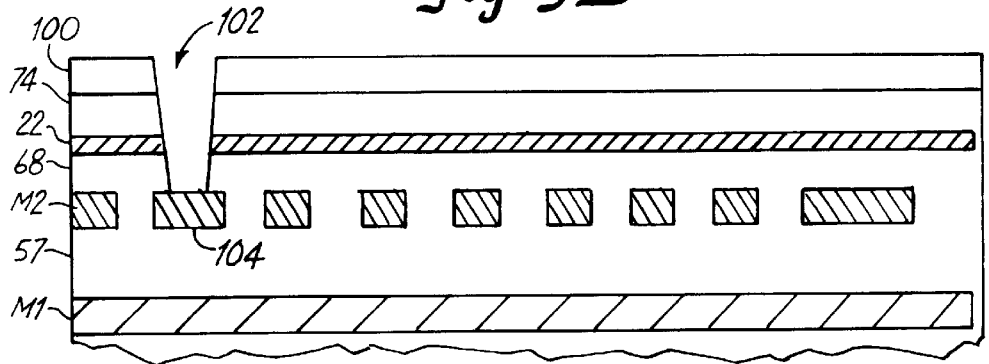
FIGS. 4A–4B are simplified, schematic representations of a cross-sectional view of the integrated circuit which illustrate one method of grounding an electromagnetic shield.
Figure 4B:
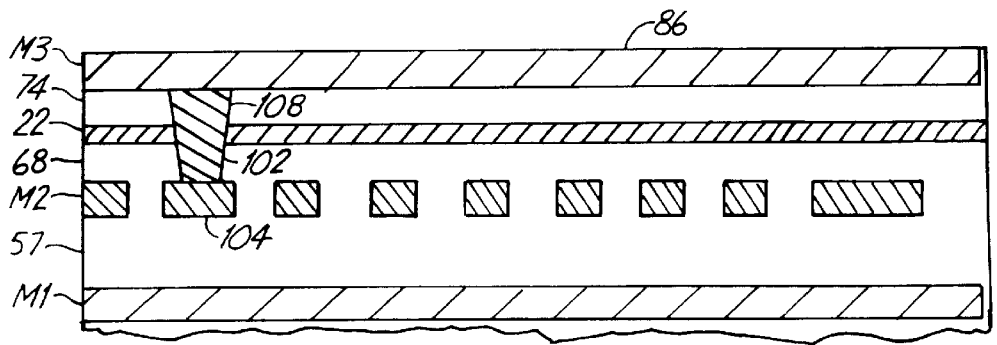

FIGS. 4A–4B are simplified, schematic representations of a cross-sectional view of integrated circuit 10 which illustrate one method of grounding electromagnetic shield 22. The same reference numerals are used in FIGS. 4A–4B as were used in FIGS. 3A–3D for the same or similar elements. In FIG. 4A, dielectric layer 74 is applied to the surface of electromagnetic shield 22, and mask layer 100 is applied to the surface of dielectric layer 74. Aperture 102 is then etched into dielectric layer 74 through mask layer 100 to the surface of electromagnetic shield 22 with a first etchant which is suitable for etching the dielectric material. A second etchant is then used to etch through electromagnetic shield 22 to the surface of dielectric layer 68. The first etchant is then used to etch through dielectric layer 68 to the surface of conductive segment 104 within routing layer M2. This exposes conductive segment 104 within aperture 102. Mask layer 102 is then removed.

Next, aperture 102 is filled with a conductive material to form a conductive plug or via 108, as shown in FIG. 4B. Conductive via 108 electrically contacts the surface of conductive segment 104 within aperture 102 and electrically contacts the sidewall of electromagnetic shield 22 within aperture 102. Conductive via 108 is then planarized at the surface of dielectric layer 74, and routing layer M3 is applied to dielectric layer 74. Routing layer M3 includes conductive segment 86 which, in this example, electrically contacts the upper surface of conductive via 108. This provides an electrical interconnection between conductive segment 86, electromagnetic shield 22 and conductive segment 104 and provides a method of grounding the shield if either conductive segment 86 or 104 is electrically coupled to one of the power or ground buses on integrated circuit 10.

Figure 5A:
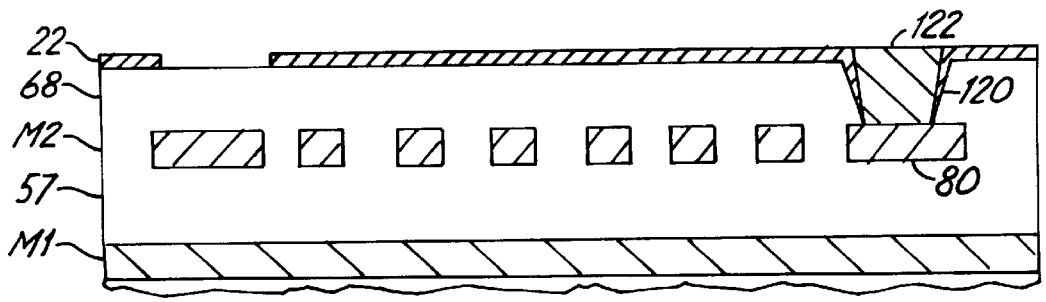
FIGS. 5A–5B are simplified, schematic representations of a cross-sectional view of the integrated circuit which illustrate another method of grounding the electromagnetic shield.
Figure 5B:
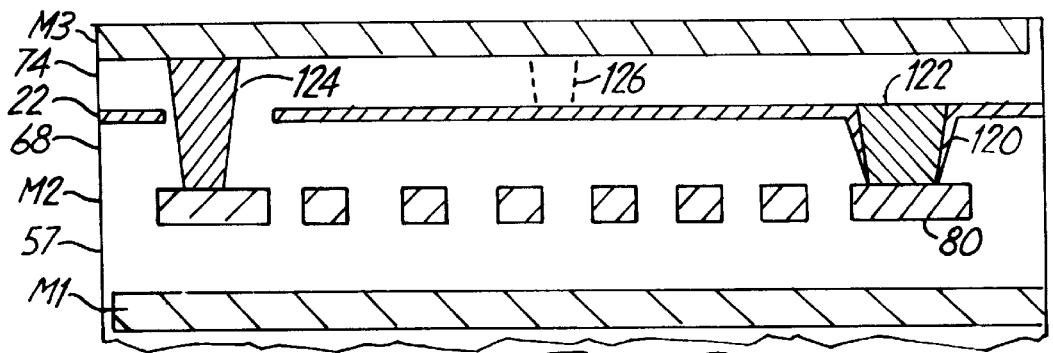

FIGS. 5A–5B are simplified, schematic representations of a cross-sectional view of integrated circuit 10 according to an alternative embodiment of the present invention. Again, the same reference numerals are used in FIGS. 5A–5B as were used in FIGS. 3A–3D and 4A–4B for the same or similar elements. Prior to depositing electromagnetic shield 22, dielectric layer 68 is masked and then etched to form an aperture 120 which extends from the surface of dielectric layer 68 to conductive segment 80. The mask is then removed and electromagnetic shield 22 is deposited onto dielectric layer 68 and along the side walls of aperture 120. Preferably, electromagnetic shield 22 electrically contacts conductive segment 80 within aperture 120. Aperture 120 is then filled with a conductive material to form a conductive plug or via 122 which electrically contacts electromagnetic shield 22 along the side walls of aperture 120 and electrically contacts conductive segment 80 within the aperture. Conductive via 122 provides an electrical interconnection between electromagnetic shield 22 and conductive segment 80 and serves as a portion of the electromagnetic shield. If conductive segment 80 is grounded, electromagnetic shield 22 becomes grounded through via 122. Extending the material of electromagnetic shield 22 into aperture 120 provides a larger surface area for the electrical connection between electromagnetic shield 22 and conductive via 122. Next, conductive via 122 is planarized at the surface of electromagnetic shield 22, and electromagnetic shield 22 is patterned through additional masking and etching steps, as discussed above.

Once electromagnetic shield 22 has been patterned, dielectric layer 74 and routing layer M3 are deposited on the surface of electromagnetic shield 22, as shown in FIG. 5B. This process can also include the formation of a via 124. Additional layers can also be applied. Electromagnetic shield 22 can also be grounded to a different conductive segment within metal layer M3 through a conductive via 126 (shown in phantom in FIG. 5B).

Figure 6A:
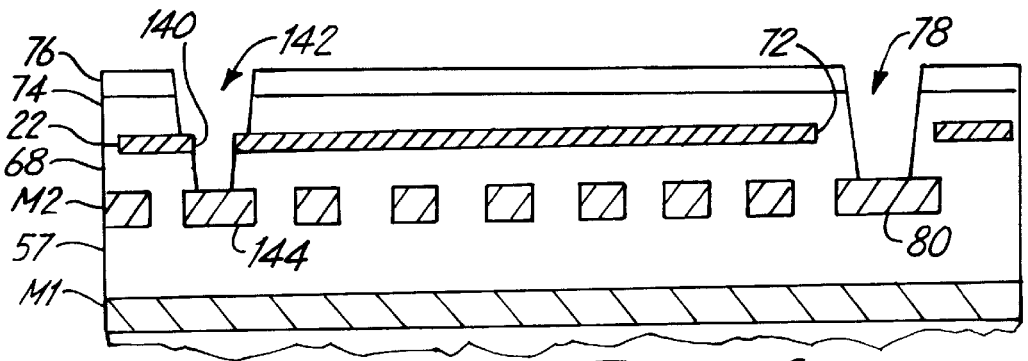
FIGS. 6A–6B are simplified, schematic representations of a cross-sectional view of the integrated circuit which illustrate another method of grounding the electromagnetic shield.
Figure 6B:
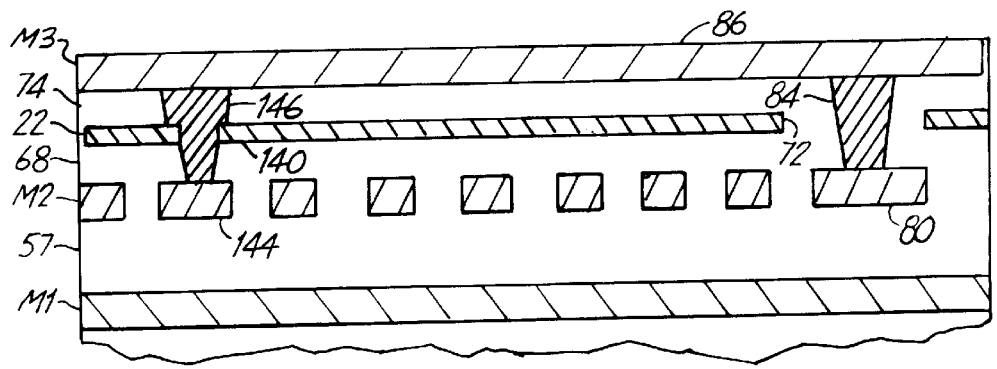

FIGS. 6A–6B are simplified, schematic representations of a cross-sectional view of integrated circuit 10 which illustrate another method of grounding electromagnetic shield 22. Again, the same reference numerals are used for the same or similar elements. In this embodiment, electromagnetic shield 22 has been patterned with two apertures, aperture 72 and aperture 140. Aperture 140 is smaller than aperture 72. As in FIG. 3C, dielectric layer 74 is applied to the surface of electromagnetic shield 22, and mask layer 76 is applied to the surface of dielectric layer 74. Mask layer 76 has a pattern with an aperture 78 that overlies aperture 72 and an aperture 142 that overlies aperture 140. Aperture 142 is at least as great or greater than aperture 140. The pattern of mask layer 76, including apertures 78 and 142, is then etched into dielectric layers 74 and 68 (through apertures 72 and 140). When the etching is completed, conductive segments 80 and 144 in routing layer M2 are exposed within apertures 78 and 142, respectively. Also, electromagnetic shield 22 is exposed within aperture 142. Mask layer 76 is then removed from dielectric layer 74.

Next, apertures 78 and 142 are filled with a conductive material, such as a tungsten, as shown in FIG. 6B. The conductive material forms conductive vias 84 and 146 which make electrical contact with conductive segments 80 and 144. Conductive via 146 also makes electrical contact with electromagnetic shield 22 within aperture 142. The size of aperture 142 can be adjusted as desired to provide more or less contact area on the surface of electromagnetic shield 22. Conductive vias 84 and 146 are then planarized, and routing layer M3 is applied to the surface of dielectric layer 74. Routing layer M3 includes conductive segment 86 which electrically contacts the surface of conductive vias 84 and 146. Various other structures and fabrication steps can be used according to the present invention to form the various layers and to ground electromagnetic shield 22 to a conductive segment in one of the routing layers.

Applying an electromagnetic shield between the uppermost memory metalization layer and the next higher logic metalization layer enables maximum flexibility of routing signal wires on top of embedded memory blocks. When the shield is grounded, the shield forms a Faraday cage that prevents electromagnetic field lines from penetrating the shield and corrupting data stored in the embedded memory. This is particularly beneficial for high density integrated circuits which combine memory and logic on the same chip since the designer can use higher routing layers to route signal wires over embedded memory blocks with no restrictions on the routing path.

Although the present invention has been described with reference to preferred embodiments, workers skilled in the art will recognize that changes may be made in form and detail without departing from the spirit and scope of the invention. The present invention can be implemented with MOS technology or with various other technologies. The term "coupled" can include various types of connections or couplings and can include a direct connection or a connection through one or more intermediate components or materials.

What is claimed is:

1. An integrated circuit comprising:
    a substrate having a memory area and a non-memory area;
    a voltage supply conductor;
    an embedded memory fabricated on the substrate within the memory area;
    at least one memory routing layer, which includes a highest memory routing layer relative to the substrate, fabricated within the memory area and electrically coupled to the embedded memory;
    first and second semiconductor cells fabricated on the substrate within the non-memory area;
    an electromagnetic shield fabricated as an additional, non-routing layer on the integrated circuit over the highest memory routing layer and covering substantially the entire memory area, wherein the electromagnetic shield is electrically coupled to the voltage supply conductor;
    a logic routing layer, which is the next-higher routing layer on the integrated circuit above the highest memory routing layer and is fabricated over the memory and non-memory areas and over the electromagnetic shield; and
    a signal wire electrically coupled between the first and second semiconductor cells and having a first conductive segment routed within the logic routing layer and extending over the memory area.

2. The integrated circuit of claim 1 wherein the logic routing layer has a thickness and the electromagnetic shield has a thickness which is up to one-half of the thickness of the logic routing layer.

3. The integrated circuit of claim 1 wherein the electromagnetic shield has a thickness of 100 Å–2500 Å.

4. The integrated circuit of claim 1 wherein the electromagnetic shield is formed of a conductive sheet of material.

5. The integrated circuit of claim 1 wherein the embedded memory comprises a dynamic random access memory (DRAM).

6. The integrated circuit of claim 1 and further comprising:
    a first dielectric layer fabricated between the highest memory routing layer and the electromagnetic shield; and
    a second dielectric layer fabricated between the electromagnetic shield and the next-higher logic routing layer.

7. The integrated circuit of claim 1 wherein the voltage supply conductor is fabricated within one of the at least one memory routing layers and the next-higher logic routing layer.

8. The integrated circuit of claim 6 wherein:
    the highest memory routing layer comprises a second conductive segment;
    the next-higher logic routing layer comprises a third conductive segment;
    the electromagnetic shield comprises an aperture; and
    the integrated circuit further comprises a conductive via electrically coupled between the second and third conductive segments and extending from the highest memory routing layer to the next-higher logic routing layer, through the first dielectric layer, the aperture and the second dielectric layer, wherein the conductive via is electrically isolated from the electromagnetic shield.

9. The integrated circuit of claim 6 wherein:
    the highest memory routing layer comprises a second conductive segment;
    the next-higher logic routing layer comprises a third conductive segment;
    the electromagnetic shield comprises an aperture having a side wall;
    the integrated circuit further comprises a conductive via which is electrically coupled between the second and third conductive segments and extends from the highest memory routing layer to the next-higher logic routing layer, through the first dielectric layer, wherein the aperture and the second dielectric layer, wherein the conductive via is electrically coupled to the electromagnetic shield at the side wall of the aperture; and
    at least one of the second and third conductive segments is electrically coupled to the voltage supply conductor.

10. The integrated circuit of claim 6 and further comprising:
    a further memory routing layer fabricated between the first dielectric layer and the embedded memory; and
    a third dielectric layer fabricated between the further memory routing layer and the embedded memory.

11. The integrated circuit of claim 6 wherein:
    the voltage supply conductor is fabricated in the highest memory routing layer;
    the first dielectric layer comprises an aperture with a side wall which extends from the electromagnetic shield to the voltage supply conductor in the highest memory routing layer;
    the electromagnetic shield is fabricated on the first dielectric layer and along the side wall of the aperture; and
    the integrated circuit further comprises a conductive via which fills the aperture and is electrically coupled to the electromagnetic shield along the side wall of the aperture and is electrically coupled to the voltage supply conductor within the aperture.

12. The integrated circuit of claim 6 wherein:
    the voltage supply conductor is fabricated in the next-higher logic routing layer;
    the second dielectric layer comprises an aperture which extends from the second conductive segment to the electromagnetic shield; and
    the integrated circuit further comprises a conductive via which fills the aperture and is electrically coupled between the voltage supply conductor and the electromagnetic shield.

13. An integrated circuit comprising:
    a substrate having a memory area and a non-memory area;
    an embedded memory fabricated on the substrate within the memory area;

first and second semiconductor cells fabricated on the substrate within the non-memory area;

a voltage supply conductor;

first, second and third routing layers which are applied over the substrate and are separated from one another by first and second dielectric layers, respectively, wherein the first and second routing layers comprise a plurality of bit lines within the memory area which are electrically coupled to the embedded memory, the second routing layer is a highest memory routing layer relative to the substrate, the third routing layer comprises a signal line which electrically couples the first semiconductor cell to the second semiconductor cell and extends over the memory area, and the third routing layer is the next-higher routing layer on the integrated circuit above the second routing layer and is separated from the second routing layer by the second dielectric layer; and means for shielding the bit lines within the memory area from an electromagnetic field generated by the signal wire over the memory area, wherein the means for shielding is electrically coupled to the voltage supply conductor.

14. An integrated circuit comprising:

a substrate having a memory area and a non-memory area;

a voltage supply conductor;

an embedded memory fabricated on the substrate within the memory area;

at least one memory routing layer, which includes a highest memory routing layer relative to the substrate, fabricated within the memory area and electrically coupled to the embedded memory;

first and second semiconductor cells fabricated on the substrate within the non-memory area;

an electromagnetic shield fabricated as an additional, non-routing layer on the integrated circuit over the highest memory routing layer and covering substantially the entire memory area, wherein the electromagnetic shield is electrically coupled to the voltage supply conductor;

a logic routing layer, which is the next-higher routing layer on the integrated circuit above the highest memory routing layer and is fabricated over the memory and non-memory areas and over the electromagnetic shield, wherein the logic routing layer has a thickness and the electromagnetic shield has a thickness which is up to one-half of the thickness of the logic routing layer; and a signal wire electrically coupled between the first and second semiconductor cells and having a first conductive segment routed within the logic routing layer and extending over the memory area.

* * * * *